US006791480B1

(12) United States Patent
Uke

(10) Patent No.: US 6,791,480 B1
(45) **Date of Patent: *Sep. 14, 2004**

(54) METHOD OF PREVENTING AND/OR ALLEVIATING REPETITIVE USE INJURY TO ELECTRONIC COMPUTER KEYBOARD OPERATOR

(76) Inventor: Alan K. Uke, 355 14th St., Del mar, CA (US) 92014

( * ) Notice: Subject to any disclaimer, the term of this patent is extended or adjusted under 35 U.S.C. 154(b) by 0 days.

This patent is subject to a terminal disclaimer.

(21) Appl. No.: 09/205,031

(22) Filed: Dec. 4, 1998

Related U.S. Application Data

(63) Continuation-in-part of application No. 08/894,112, filed as application No. PCT/US96/18835 on Dec. 13, 1996, now abandoned.

(51) Int. Cl.[7] ........................ H03K 17/94; H03M 11/00
(52) U.S. Cl. ........................ 341/34; 200/515; 400/491.2
(58) Field of Search ..................... 341/34, 22; 400/481, 400/491.2; 200/251, 515

(56) References Cited

U.S. PATENT DOCUMENTS

| | | | | |
|---|---|---|---|---|
| 793,462 | A | | 6/1905 | Munson |
| 1,218,760 | A | | 3/1917 | Graham |
| 2,619,215 | A | | 11/1952 | Guss |
| 2,973,079 | A | | 2/1961 | Henatsch |
| 3,448,419 | A | | 6/1969 | Myatt |
| 3,480,744 | A | | 11/1969 | Yamada |
| 3,693,775 | A | | 9/1972 | Brooks et al. |
| 3,736,397 | A | | 5/1973 | Pedersen |
| 3,767,022 | A | | 10/1973 | Olson |
| 3,805,939 | A | | 4/1974 | Ross |
| 3,964,593 | A | | 6/1976 | Pointon |
| 3,964,594 | A | | 6/1976 | Gabbrielli et al. |
| 4,039,068 | A | | 8/1977 | Giorza et al. |
| 4,247,208 | A | | 1/1981 | Fulkerson et al. |
| 4,362,408 | A | * | 12/1982 | Cordes et al. ........... 400/491.2 |
| 4,381,691 | A | | 5/1983 | Conklin, Jr. et al. |
| 4,734,679 | A | | 3/1988 | Haskins |
| 4,791,257 | A | | 12/1988 | Frey et al. |
| 4,906,117 | A | | 3/1990 | Birdwell |
| 4,948,281 | A | | 8/1990 | Werner |

(List continued on next page.)

FOREIGN PATENT DOCUMENTS

| | | | |
|---|---|---|---|
| WO | WO 97/21547 | A1 | 6/1997 |
| WO | WO 00/73078 | A1 | 12/2000 |
| WO | WO 02/34539 | A1 | 5/2002 |

OTHER PUBLICATIONS

David Rempel, MD, Effect of Keyboard Keyswitch Design on Hand Pain, JOEM—vol. 41, No. 2, Feb. 1999 9 page.

Dual Force Automatic Rekeying, IBM Technical Disclosure Bulletin—pp 164–165, Jun. 1974.

PCT/US00/41573—International Search Report—Jun. 15, 2001.

PCT/US99/28691—International Search Report—Apr. 3, 2000.

PCT/US96/18835—International Search Report—Mar. 12, 1997.

*Primary Examiner*—Timothy Edwards
(74) *Attorney, Agent, or Firm*—Richard J. Warburg; Foley & Lardner

(57) ABSTRACT

An electronic computer keyboard is constructed to provide the minimum keystroke resistance sufficient to prevent accidental switch closures otherwise resulting from the weight of the operator's fingers resting on the keys. This forces the operator to move his or her hands over the keyboard with locked wrists. It also eliminates the need of the operator to hold his or her hands up to prevent inadvertent key depressions thereby reducing stress and fatigue on the operator's shoulders, forearms, wrists and hands.

22 Claims, 6 Drawing Sheets

U.S. PATENT DOCUMENTS

| | | | | |
|---|---|---|---|---|
| 4,969,403 | A | | 11/1990 | Schwartz et al. |
| 5,088,668 | A | | 2/1992 | Grimm |
| 5,119,078 | A | | 6/1992 | Grant |
| 5,129,747 | A | | 7/1992 | Hutchison |
| 5,131,614 | A | | 7/1992 | Garcia et al. |
| 5,180,237 | A | | 1/1993 | Chen |
| 5,183,346 | A | | 2/1993 | Tesar |
| 5,220,318 | A | * | 6/1993 | Staley ........................ 400/481 |
| 5,228,791 | A | | 7/1993 | Fort |
| 5,230,345 | A | | 7/1993 | Curran et al. |
| 5,268,545 | A | | 12/1993 | Bruner |
| 5,273,250 | A | | 12/1993 | Pemberton et al. |
| 5,278,779 | A | | 1/1994 | Conway et al. |
| 5,287,090 | A | | 2/1994 | Grant |
| 5,290,115 | A | | 3/1994 | Little |
| 5,352,050 | A | | 10/1994 | Choate |
| 5,391,006 | A | | 2/1995 | Danziger |
| 5,405,204 | A | | 4/1995 | Ambrose |
| 5,421,543 | A | | 6/1995 | Rossman et al. |
| 5,428,368 | A | | 6/1995 | Grant |
| 5,434,566 | A | | 7/1995 | Iwasa et al. |
| 5,439,192 | A | | 8/1995 | King |
| 5,445,349 | A | | 8/1995 | Hart |
| 5,494,363 | A | | 2/1996 | Hochgesang |
| 5,525,979 | A | | 6/1996 | Engle et al. |
| 5,535,091 | A | | 7/1996 | Lee |
| 5,588,760 | A | | 12/1996 | So |
| 5,600,361 | A | | 2/1997 | Dirx |
| 5,626,222 | A | * | 5/1997 | Aguilera ..................... 200/305 |
| 5,676,476 | A | | 10/1997 | Uke |
| 5,677,826 | A | | 10/1997 | Sellers |
| 5,879,088 | A | | 3/1999 | English |
| 5,899,616 | A | | 5/1999 | Caplan |
| 5,933,133 | A | | 8/1999 | Lohr |

* cited by examiner

METHOD OF PREVENTING AND/OR ALLEVIATING REPETITIVE USE INJURY TO ELECTRONIC COMPUTER KEYBOARD OPERATOR

CROSS-REFERENCE TO RELATED APPLICATION

This application is a continuation-in-part of U.S. patent application Ser. No. 08/894,112 filed Aug. 12, 1997 (abandoned), which is a 35 U.S.C. §371 filing of PCT/US96/18835 filed Dec. 13, 1996, which in turn claims priority of U.S. patent application Ser. No. 08/572,091 filed Dec. 14, 1995 (now U.S. Pat. No. 5,676,476).

BACKGROUND OF THE INVENTION

The present invention relates generally to keyboards for computers, electric typewriters and similar manual data input devices utilizing the standard QWERTY key format, and more particularly, to an electronic computer keyboard with enhanced ergonomic properties for preventing and/or alleviating injury to the forearms, wrists and hands of an operator normally associated with repetitive use.

Conventional keyboards for computers, typewriters, or similar machines typically have a set of keys arranged substantially in a single plane that may be flat or slightly tilted toward the operator. The standard key arrangement used by a majority of keyboard manufacturers throughout the world has at least three parallel rows of ten or more keys. The keys of one row are staggered relative to the keys of an adjacent row. The keys typically include the twenty-six letter keys arranged in the standard QWERTY format and four punctuation keys. In addition to the alphabetic keys, conventional keyboards specifically designed for use with computers also have numeric keys and function keys which are typically located above, below, or on one or both sides of the alphabetic keys. The function keys typically include, for example, the tab, shift, and return keys as well as the alt, control, and option keys. During typing, the operator's forearms are positioned at inwardly directed angles from the operator's sides toward the keyboard, with the palms down and the hands generally flat. The wrists are bent and the hands are angled outwardly relative to the forearms in order to align the operator's fingers in directions running from the front to the back of the keyboard. The operator repeatedly pivots his or her hands at the wrist joints side-to-side over the keyboard in order to select and actuate the individual keys.

Adverse physical conditions may arise in the operator's wrists, hands and fingers resulting from the kind of repetitive motions associated with typing on a conventional electronic computer keyboard, particularly for long periods on any given day or successive days. Such adverse conditions are compounded by the conventional design of conventional electronic keyboards which encourages the side-to-side flexing of the operator's wrists, hands and fingers into particularly awkward and unnatural angles for prolonged periods of time. Typing injuries may fall into one of a few overlapping categories: repetitive stress disorder, repetitive motion injury, cumulative trauma disorder, and carpal tunnel syndrome. These conditions often require medical attention and, in severe cases, the worker may be unable to perform normal work functions. The cost in human suffering, and on-going medical expenses may be severe.

Various wrist/arm supports, keyboard geometries and positionable desktop surfaces for preventing injury to keyboard operators have been patented in the United States. Some of these patented devices have met with limited commercial success. However, none of them has been completely successful in preventing injury to the forearms, wrists and hands of an electronic keyboard operator.

Before the advent of modern electronic computer keyboards, it was relatively rare for full time operators of manual (non-electric) typewriters to experience injury to their forearms, wrists or hands, even if they typed forty hours per week. With the advent of modern electronic computer keyboards, particularly those associated with personal computers, a common design objective has been to provide minimal keystroke length and minimal keystroke resistance. The apparent objective has been to make typing and data entry easier and faster. The primary constraint on minimizing both keystroke length and keyboard keystroke resistance has been the fact that both need to be significant enough to prevent spurious key switch closures.

SUMMARY OF THE INVENTION

Accordingly, it is the object of the present invention to provide a method that uses an electronic computer keyboard with enhanced ergonomic properties to prevent and/or alleviate injury to the forearms, wrists and/or hands of an operator.

According to my invention an electronic computer keyboard is constructed to provide the minimum keystroke resistance sufficient to prevent accidental switch closures otherwise resulting from the weight of the operator's fingers resting on the keys. This forces the operator to move his or her hands over the keyboard with locked wrists. It also eliminates the need for the operator to hold his or her hands up to prevent inadvertent key depressions thereby reducing stress and fatigue on the operator's shoulders, forearms, wrists and hands.

DESCRIPTION OF THE PREFERRED EMBODIMENTS

Conventional electronic computer keyboards have keys that can be depressed with less than seventy grams of force and with less than five millimeters of keystroke length. The problem with this type of "light touch" design is that an operator tends to angle his or her wrists back and forth as much as thirty degrees in reaching for various keys. Furthermore, the weight of an operator's fingers combined with the natural downward flexing of the fingers is usually sufficient to depress a key. Therefore, the operator induces stress and fatigue in his or here wrists supporting the hands so that the fingers do not inadvertently depress the keys. If greater keystroke resistance and/or keystroke length were required in order to enter a particular letter, numeral, symbol or command, the operator would naturally tend to lock his or her wrists and move the hands over the keys, eliminating the severe wrist flexure. While this type of movement requires angling of the forearms by pivoting the shoulder, such angling is minimal, for example two to five degrees, and does not lead to injuries in the arms or shoulders. This may be due to the fact that the ball and socket construction of the shoulder joint is more conducive or natural to this type of side-to-side movement than the wrist joint.

Figure 1:
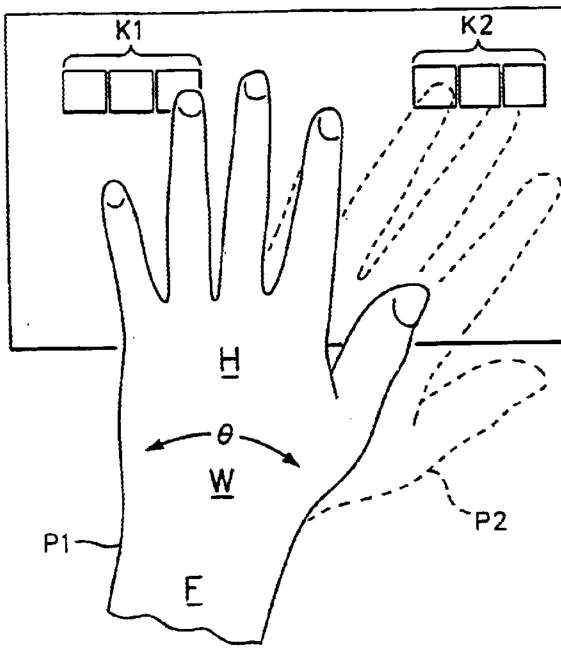
FIG. 1 (PRIOR ART)
FIG. 1 is simplified plan view illustrating an operator's left forearm, wrist and hand actuating a conventional electronic computer keyboard. The hand is shown in two different positions in sold lines and phantom lines.

Referring to FIG. 1, a conventional electronic computer keyboard KB is illustrated which includes a first plurality of keys, including keys K1 and K2, arranged in the standard QWERTY key format, and a second plurality of keys K3 arranged to the side normally including numeral keys and command keys. The conventional electronic computer keyboard KB also includes a space bar (not illustrated) adjacent the lower edge, function keys (not illustrated) adjacent the upper edge and other command keys (not illustrated). The conventional electronic computer keyboard KB is constructed in well known fashion and includes an outer frame, a plurality of keys each having guide posts received in corresponding guide mechanisms mounted in the frame. Springs normally surround the guide posts and bias the keys upwardly. The lower ends of the guide posts are located above corresponding switches which may have a laminated membrane-type construction, for example. Typically the springs are selected so that the keystroke resistance force is approximately seventy grams. This is the average approximate force required to be applied by the operator's fingers to depress a key sufficiently to cause the lower end of its associated guide post to actuate the corresponding switch and close electrical contacts therein. Electrical signals are generated and recognized by the mother board of the personal computer as indicating that the operator has depressed a particular key at a particular moment. Normally the guide post associated with each key and the guide mechanism associated with each guide post are configured so that the key travels less than five millimeters between its uppermost and lowermost positions. The keystroke is thus the distance a key travels from its raised at rest position to its fully depressed position in which the lower end of its guide post actuates the associated electrical switch.

Referring still to FIG. 1, the conventional electronic computer keyboard KB has such a light touch, i.e. requires so little force and/or so little keystroke travel to actuate the associated switch, that it is only necessary for the operator's hand H to shift angularly between the position P1 shown in solid lines in FIG. 1 and the position P2 shown in phantom lines in FIG. 1. This causes the operator's wrist W to move through a substantial angle Θ which can be as much as thirty degrees. When the operator's hand H moves between the positions P1 and P2, his or her forearm F remains more or less stationary. The type of hand and wrist movement illustrated in FIG. 1 can occur, for example, when the user first depresses one key of the set K1 with his or her ring finger and then moves to depress one key of the set K2 with the same finger. It is the back and forth repetitive movement of the operator's wrist W through the angle Θ that may lead to physical injury. If the operator rests his or her hands on the keys of the keyboard KB, the weight of his/her fingers will depress the keys and close the associated switches.

Figure 2:
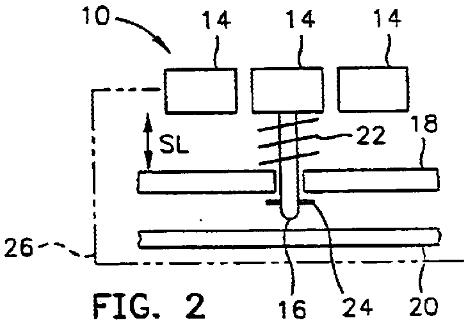
FIG. 2 is an enlarged diagrammatic vertical sectional view of a portion of an electronic computer keyboard that may be utilized to carry out the method of the present invention.

Referring to FIG. 2, in accordance with my invention, an electronic computer keyboard 10 includes a plurality of keys 14. Each key 14 is connected to or formed with, such as by injection molding, a downwardly extending guide post 16. Only the center key 14 is shown with its guide post 16 in FIG. 2. The electronic computer keyboard 10 further includes one or more vertically spaced guide plates 18 having holes for slidably receiving the guide post 16 of each of the keys 14. Only one hole is shown in the guide plate 18 for the sake of clarity. For simplicity, only the structure associated with the center key 14 will be described. It will be understood that all the other keys 14 have similar guide posts, guide mechanisms and associated switches.

The guide post 16 and guide plate 18 form a guide mechanism for permitting vertical reciprocal movement of the key 14. Beneath the lower end of the guide post 16 is a laminated membrane-type switch assembly 20 including a plurality of electrical switches. Each of these switches is located directly beneath the curved lower end of a corresponding guide post 16. A coil spring 22 surrounds the guide post 16 of the key 14. The spring 22 is compressed between the key 14 and the guide plate 18. A retainer 24 surrounds the lower end of the guide post 16 to prevent the key 14 from falling out of the keyboard 10. The foregoing components are all mounted in, and supported by, a surrounding plastic frame illustrated diagrammatically by phantom line 26. The key 14 is normally biased upwardly to its at rest position by the spring 22. The key 14 can be pushed downwardly by an operator's finger through a predetermined keystroke length SL to cause the lower rounded end of the guide post 16 to engage and close the associated electrical switch in the laminated switch assembly 20.

In accordance with the present invention, the compressive strength of the spring 22 is selected to provide the minimum keystroke resistance sufficient to prevent accidental switch closures from the weight of the operator's fingers resting on the alphanumeric keys. This keystroke resistence will typically be a minimum of about seventy grams. The keystroke resistance is the amount of force that must be applied by an operator's finger in a downward direction to cause the lower end of the guide post 16 to close the associated switch in the switch assembly 20. Also, in accordance with the present invention, the keystroke length SL may also be selected to achieve therapeutic results in combination with the increase in keystroke resistance. A keystroke length SL of greater than about five millimeters, and more preferably, greater than about ten millimeters may be beneficial. The keystroke length SL is defined as the distance that the key 14 must travel from its uppermost, at rest position, to its lowermost position in which the lower end of the guide post 16 engages and closes the corresponding switch in the switch assembly 20.

The effective upper limit for both the keystroke resistance and keystroke length would in all likelihood be those exhibited by conventional, non-electric typewriters, such as those sold for many years in the United States prior to 1960 under the Trademarks UNDERWOOD, SMITH CORONA and others. Most electronic computer keyboard operators would probably dislike a keystroke resistance higher than three hundred grams. A preferred range would be between seventy grams and two-hundred twenty grams, and more preferably, between about ninety grams and one hundred and twenty grams. Of course large keys, such as the space bar, preferably have a higher keystroke resistance than that of the alphanumeric keys since the weight of more than one finger will normally rest on the same.

Figure 3:
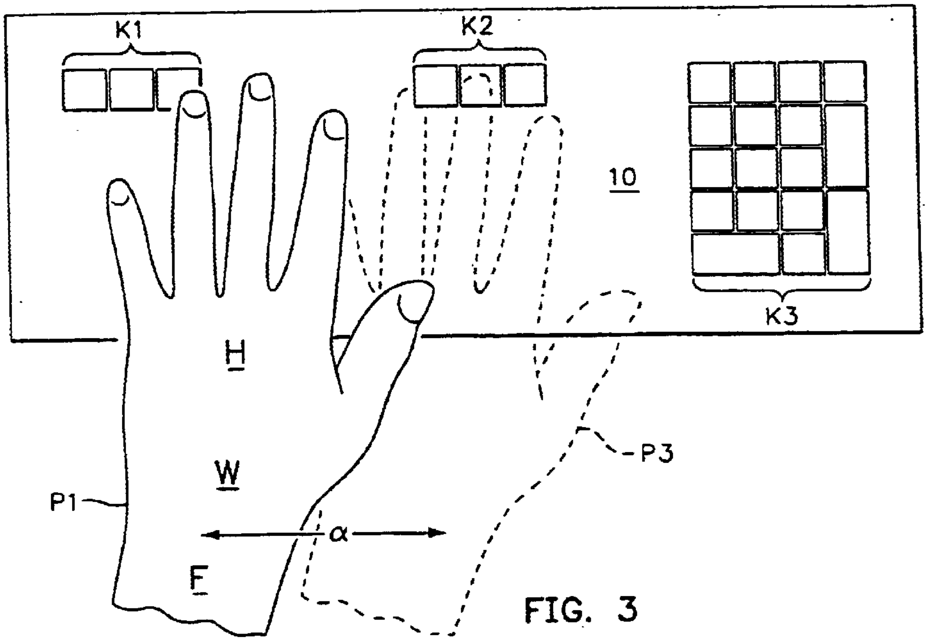
FIG. 3 is a simplified plan view similar to FIG. 1 illustrating an operator's left forearm, wrist and hand actuating an electronic computer keyboard that may be utilized to carry out the method of the present invention. The hand, wrist and forearm are shown in a first position in solid lines and in a second position in phantom lines.

FIG. 3 illustrates the movement of the operator's hand H, wrist W and forearm F when he or she uses the electronic computer keyboard apparatus 10 constructed in order to carry out the method of my invention. More particularly, when the operator wishes to depress the far right key of the set K1 with his or her ring finger, and then depress one of the keys of the set K2 with his or her middle finger, it is necessary for the operator to lock his or her wrist W. In FIG. 3, the initial position of the operator's hand H, wrist W and forearm F is shown in solid lines. When moving between the keys K1 and the keys K2, the operator's hand, wrist and forearm move from the position P1 shown in solid lines to the position P3 shown in phantom lines. The important thing to note in this operation is that the operator's wrist is locked and no longer swings through the angle Θ. Instead, the operator's forearm F moves through a much smaller angle a typically less than ten degrees. Because the operator has locked his or her wrist, the tendency to develop an injury to the shoulders, forearms, wrists or hands from repetitive movements associated with the operation of the electronic computer keyboard 10 is greatly reduced when the keyboard is operated for an extended period to enter text and/or numbers into an application on a computer associated with the keyboard compared to a conventional electronic keyboard KB (FIG. 1). The extended period could be several hours in a given day over weeks or months.

FIGS. 4–9 illustrate another electronic computer keyboard construction which is particularly suited to retrofitting existing electronic computer keyboards to provide increased keystroke resistance. All of its keys, switches and guide mechanisms are similar so only one will be described. Each key 14 is made of injection molded plastic and includes a downwardly extending cylinder 28 (FIG. 6) having a centrally located crisscross shaped hole 30. The upper end **16*a* (FIG. 4) of the guidepost 16 has a crisscross shape so that it can be snugly received into the hole 30 in the cylinder 28. A PC board 34 (FIG. 4) supports an upwardly opening box-shaped receptacle 36. The receptacle 36 has a downwardly extending projection 38 which is received in a locating aperture 40 in the PC board 34. Inside the receptacle 36 is a centrally located vertical guide tube 42. The lower half of the coil spring 22 surrounds the guide tube 42**.

The guide post 16 (FIG. 4) has a main body **16*b* from which projects a hook shaped actuator 16*c*. The guide post 16 has a cylindrical, rounded lower segment 16*d* that slides upwardly and downwardly within the guide tube 42. During this motion, the actuator 16*c* moves an inverted L-shaped Copper switch element 44 into and out of contact with U-shaped Copper switch element 46. This makes and breaks a circuit connection. The switch elements 44 and 46 are connected through the receptacle 36 to circuit traces (not illustrated) on the upper surface of the PC board 34**.

A key support assembly 48 (FIGS. 4, 5 and 9) is mounted over the top of the receptacle 36 and held in place by four downwardly extending tabs 50. The tabs 50 have projections 52 which seat in corresponding detents (not illustrated) formed in opposite vertical sidewalls of the receptacle 36. The key support assembly 48 has an aperture 54 which extends vertically therethrough. The guide post 16 reciprocates upwardly and downwardly through the aperture 54 of the key support assembly 48. A rectangular elastomeric booster spring 56 is seated between the upper generally horizontal surface **48*a* of the key support assembly 48 and the underside 14*a* (FIG. 6) of the key 14. In this embodiment the coil spring 22 serves as a base spring and the elastomeric spring 56 serves as a booster spring. Together they provide the keystroke resistance. The elastomeric booster spring 56 is made of a material having a suitable durometer or hardness necessary to achieve the keystroke resistance in the ranges identified above. By way of example, suitable elastomeric materials include polyurethane, polypropylene, polyethylene, and various blends of these materials. Of course, synthetic and natural rubbers could also be utilized. The foregoing list of materials is meant to be exemplary, and not exclusive. The booster spring 56 has an overall rectangular configuration including four sidewalls 56*a*, 56*b*, 56*c*, and 56*d*. The sidewalls 56*a* and 56*d* have inclined upper edges to ensure proper engagement with the underside 14*a* of the key 14 which is typically angled relative to the upper surface 48*a* of the key support assembly 48. Each of the sidewalls has an upwardly opening vertical slit 58. The slits received corresponding downwardly extending ribs 60 (FIG. 6) formed on the underside 14*a* of the key 14. In this manner, the booster spring 56 is centrally located in position between the spring 14 and the underlying key support assembly 48**.

The electronic computer keyboard construction of my invention illustrated in FIGS. 4–9 is particularly adapted to retrofitting existing electronic computer keyboards. Sets of elastomeric booster springs can be sold in packages at retail computer outlets. Individual computer owners can remove the keys from their electronic computer keyboards relatively easily, insert the booster springs in position, and replace the keys. Alternatively, this could be done as service by a retail computer outlet. The booster springs would be available in range of durometers so that a user could select a particular keystroke resistance fitting his or her particularized needs. Alternatively, the booster springs could be installed by original equipment manufacturers (OEMs) of electronic computer keyboards.

Figure 7:
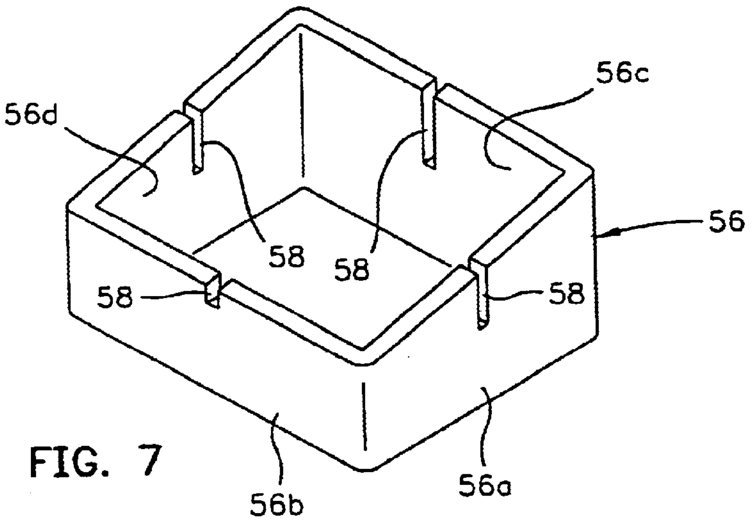
FIG. 7 is a perspective view of the elastomeric booster spring illustrated in FIG. 4 showing its rib receiving slits.
Figure 8:
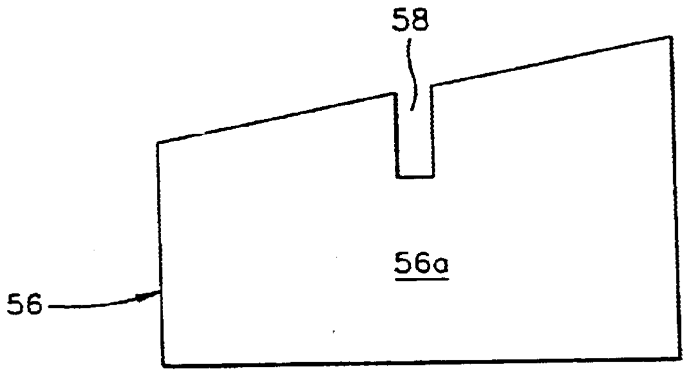
FIG. 8 is side elevation view of the booster spring of FIG. 7.
Figure 9:
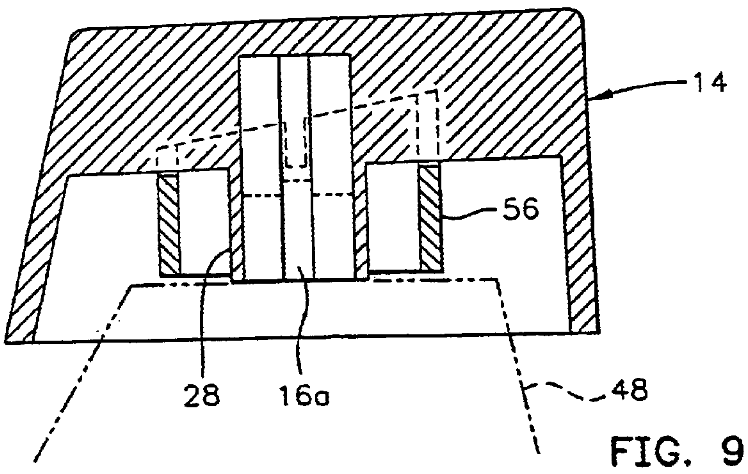
FIG. 9 is a vertical sectional view through the key and elastomeric booster spring of FIG. 4 showing, the manner in which they mate. The associated key support assembly is shown in phantom lines.
Figure 10:
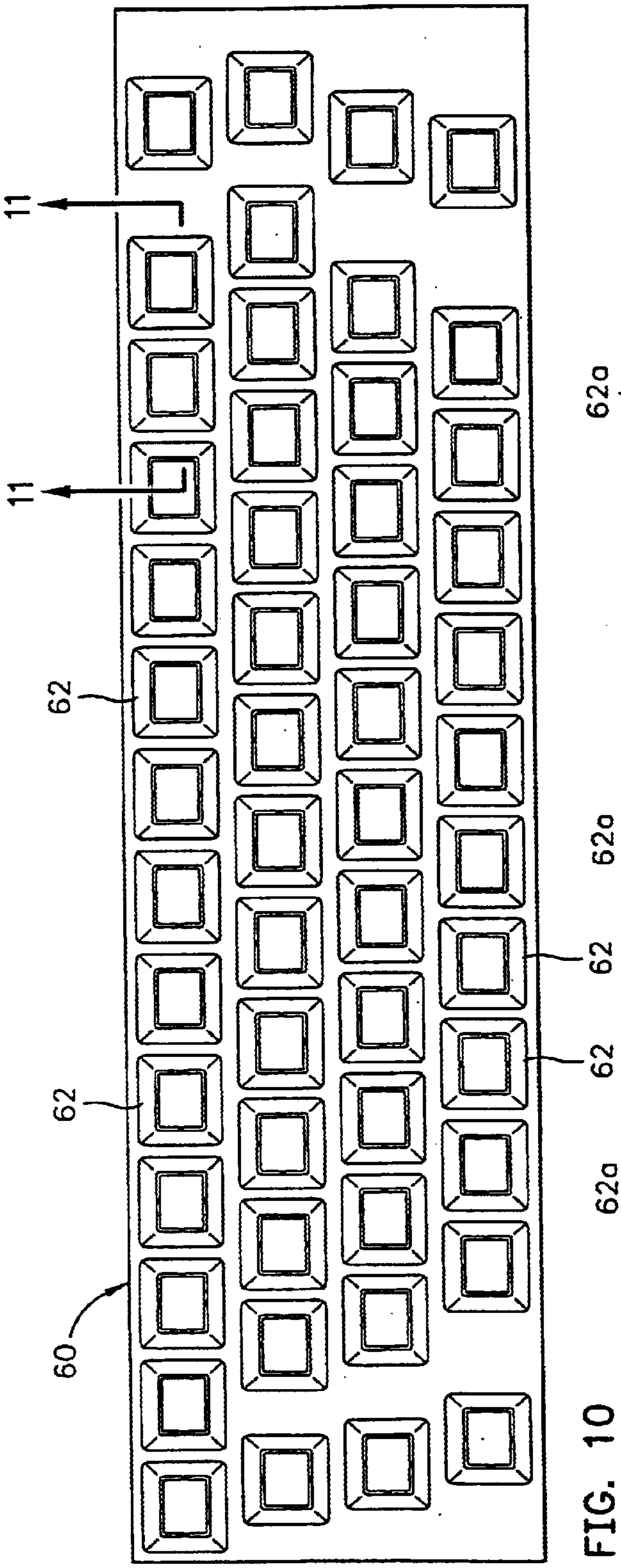
FIG. 10 is a plan view of an elastomeric template that may be used to simultaneously retrofit multiple keys of a conventional electronic computer keyboard.
Figure 11:
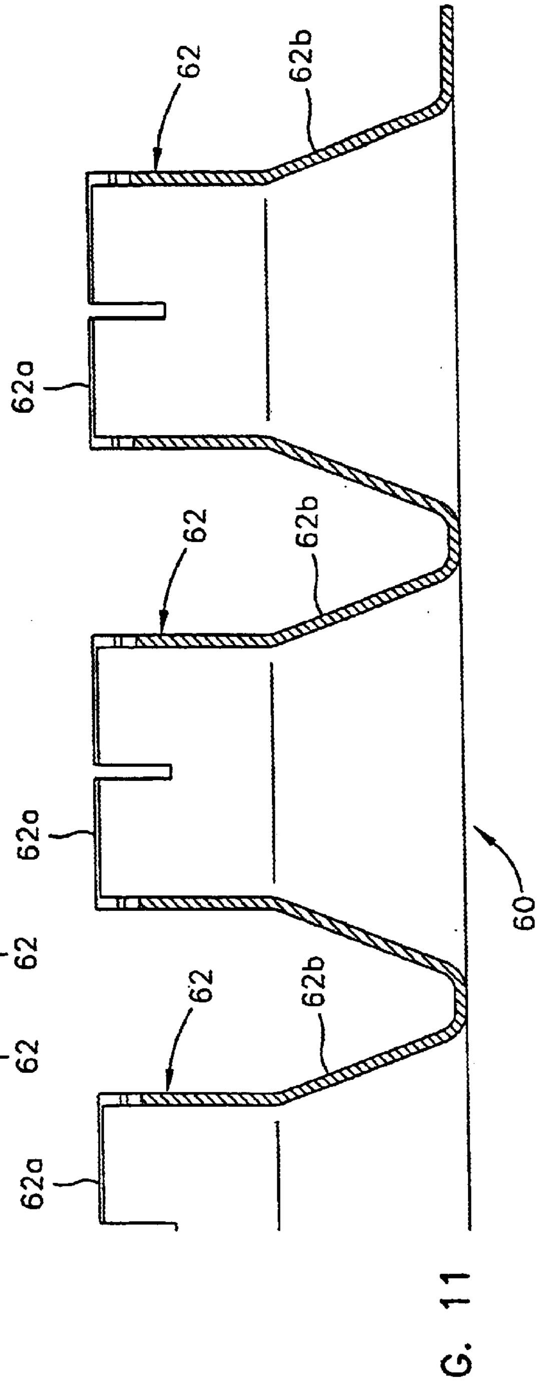
FIG. 11 is an enlarged vertical sectional view of the elastomeric template taken along line 11—11 of FIG. 10.

FIGS. 10 and 11 illustrate an alternate way to modify existing electronic computer keyboards in order to perform the method of the present invention. An elastomeric template 60 is injection molded, or otherwise formed as a single unitary piece of elastomeric material having a waffle-like configuration. More particularly, as best seen in FIG. 11, a plurality of individual booster spring elements 62 are connected to one another in spaced apart, uniform fashion. The upper portion **62*a* (FIG. 11) of each booster spring element 62 has the same configuration as the booster spring 56 (FIGS 7 and 8). The lower portion 62*b* of each booster spring element 62 is flared in order to fit around and enclose the corresponding key support assembly 48 (FIG. 9). It will thus be understood that the template 60** may be utilized by OEMs during the fabrication of electronic computer keyboards to rapidly provide the required keystroke resistance for each of the keys, without the necessity of installing a large number of individual booster springs.

Figure 4:
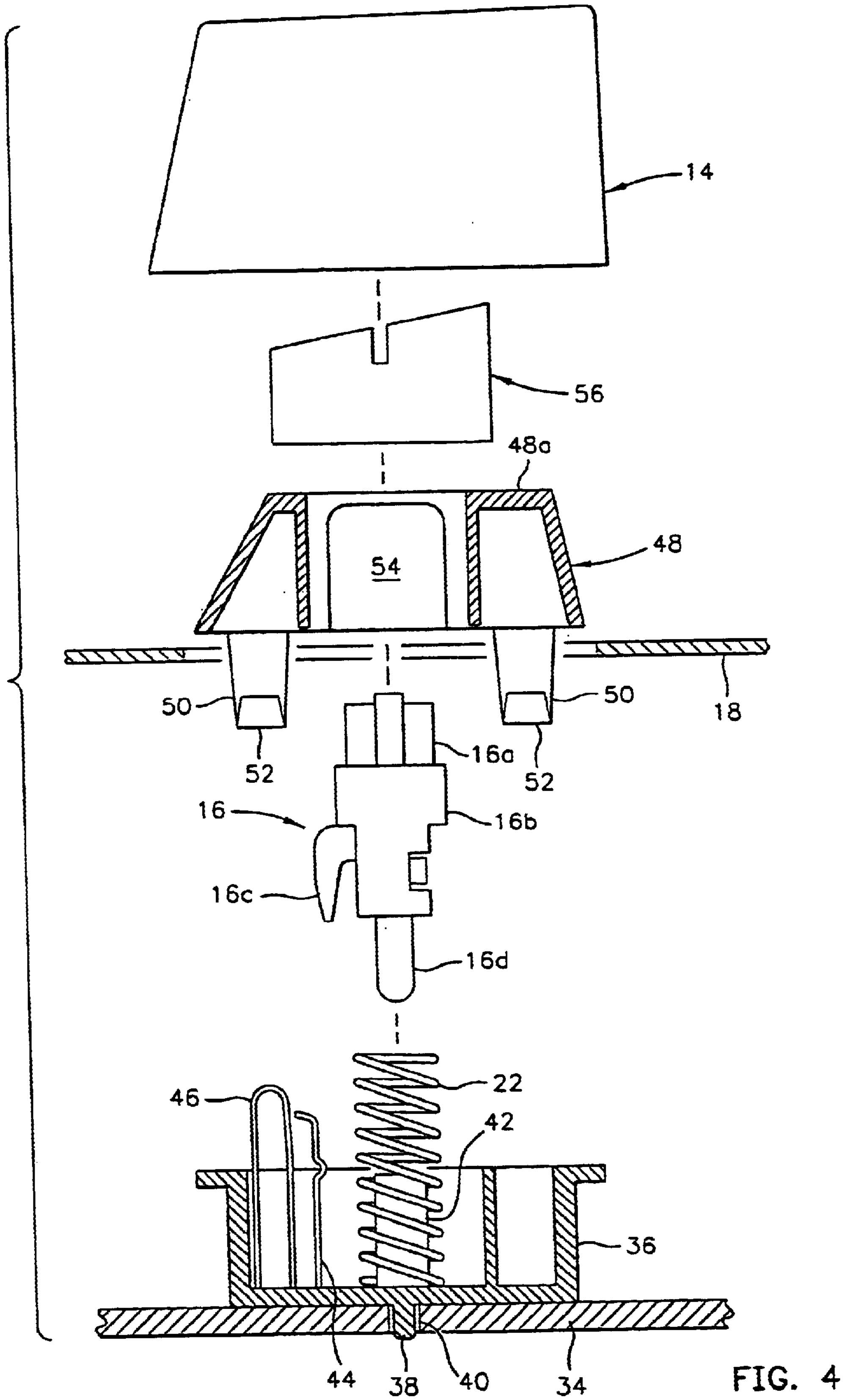
FIG. 4 is an enlarged partially exploded and partially vertical sectional view through a portion of an electronic computer keyboard illustrating the manner in which its individual key support assemblies can be retrofitted with elastomeric booster springs to increase keystroke resistance.
Figure 5:
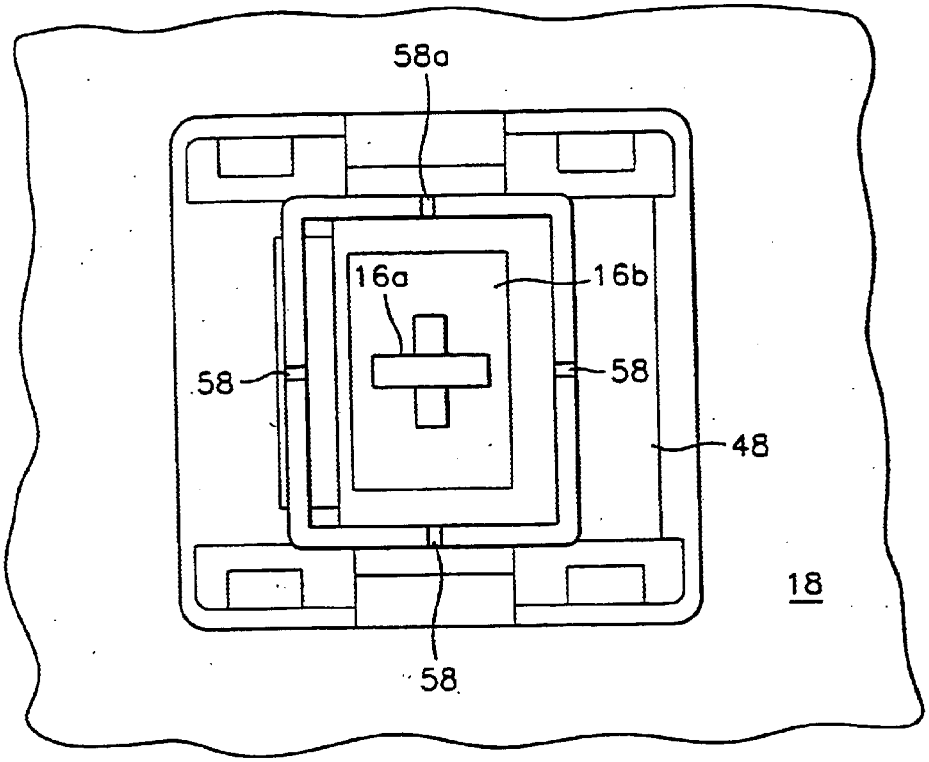
FIG. 5 is a top plan view of the key support assembly illustrated in FIG. 4.
Figure 6:
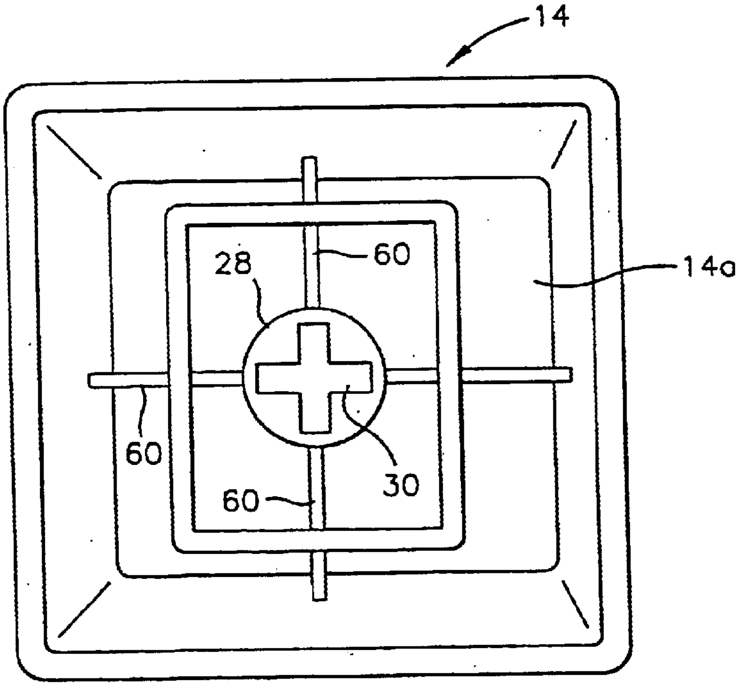
FIG. 6 is a bottom plan view of the key illustrated in FIG. 4.
Figure 12:
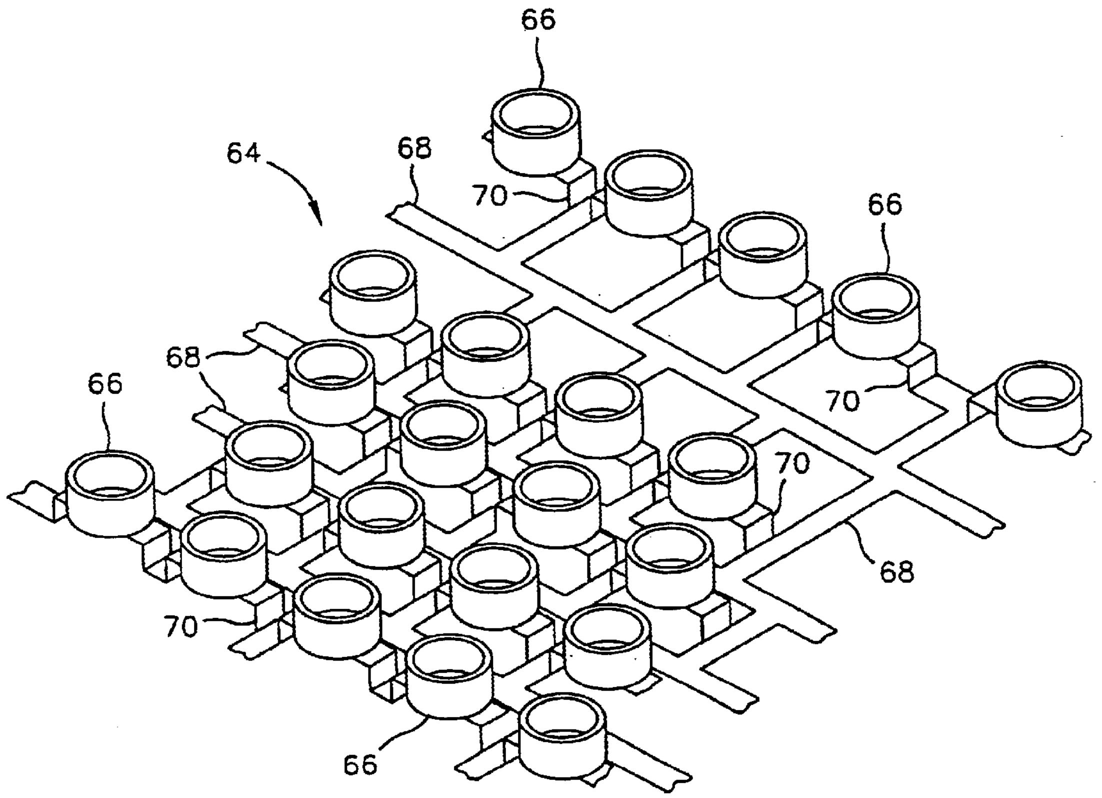
FIG. 12 is a fragmentary perspective view of a plurality of cylindrical booster springs made of an elastomeric material interconnected by an elastomeric tree structure.

FIG. 12 is a fragmentary perspective view of a still further way to modify existing electronic computer keyboards so that they can be used to perform my method. A lattice structure 64 includes a plurality of cylindrical booster springs 66 made of an elastomeric material interconnected by a tree structure in the form of a plurality of elastomeric ribs 68. The lattice structure can be molded as one integral unit. The spacing of the cylindrical booster springs 66 is determined by the lengths of the row-oriented and column-oriented ribs 68. The ribs 68 are connected to the cylindrical booster springs 66 via L-shaped elastomeric connectors 70. This permits the booster springs 66 to sit on top of corresponding key support assemblies 48. The connectors 70 extend downwardly around the sides of the key support assemblies 48. The ribs 68 therefore extend generally horizontally at a lower level between the keys 14 adjacent and parallel to the guide plate 18 (FIGS. 4 and 5). The lattice structure 64 is particularly suited for OEM manufacturing.

The present invention may be modified in both arrangement and detail. For example, benefits may be achieved by either increasing the keystroke resistance as indicated, increasing keystroke length as indicated, or by increasing both. Multiple springs can be used to increase the keystroke resistance of the wide space bar. The coil springs in the keyboard could be completely replaced with elastomeric springs, or the increased keystroke resistance could come from a combination of the existing coil springs supplemented by elastomeric booster springs. The booster springs could also be coil or other metal type springs. A combination of base springs and booster springs, both made of suitable elastomeric material could also be used. The present invention can either be designed into the electronic keyboards themselves by OEMs or can be accomplished by using a retrofit kit consisting of individual booster springs, elastomeric templates or some other convenient way of increasing the keystroke resistance into the ranges identified, without impairing switch closure capability. Versions of the computer keyboard could be produced with higher keystroke resistance for male users and a somewhat lesser keystroke resistance for female users. Therefore, the protection afforded the present invention should only be limited in accordance with the following claims.

I claim:

1. A method of preventing and/or alleviating injury to the forearms, wrists and hands of an operator from repetitive use of an electronic keyboard, comprising the steps of:

providing an electronic computer keyboard with a plurality of alphanumeric keys to be individually depressed by the fingers of an operator to close a plurality of switches, each associated with a corresponding one of the keys: and incorporating elastomeric spring means in the electronic computer keyboard for providing a minimum keystroke resistance for each of the keys sufficient to prevent accidental switch closures otherwise resulting from the weight of the operator's fingers resting on the keys.

2. The method of claim 1 wherein the keystroke resistance is greater than about seventy grams.

3. The method of claim 1 wherein the keystroke resistance is less than about three hundred grams.

4. The method of claim 1 wherein the keystroke resistance is between about seventy grams and about two-hundred and twenty grams.

5. The method of claim 1 wherein the keystroke resistance is between about ninety grams and about one-hundred and twenty grams.

6. A keyboard comprising:

a plurality of moveable alphanumeric keys;

a switch associated with each of the plurality of keys;

a plurality of elastomeric springs disposed to resist movement of said keys, at least some of said elastomeric springs having a resistive force greater than 70 grams and less than 300 grams.

7. The keyboard according to claim 6, wherein each of said elastomeric springs has a resistive force greater than 90 grams and less than 120 grams.

8. The keyboard according to claim 6, wherein each of said elastomeric springs has a resistive force of about 80 grams.

9. The keyboard according to claim 6, wherein some of said elastomeric springs have different resistive forces.

10. A keyboard comprising:

a frame;

a plurality of guide means;

a plurality of alphanumeric keys being mounted on at least one of said guide means; and a plurality of elastomeric springs for resisting motion of said keys, said elastomeric springs each providing a keystroke resistance for each of said keys of between 70 and 300 grams.

11. A keyboard in accordance with claim 10 wherein said keystroke resistance is 80 grams or higher.

12. A keyboard in accordance with claim 11 wherein said. keystroke resistance is between 80 grams and 120 grams.

13. A method of using a keyboard having a plurality of keys, each key with a keystroke resistance preventing or reducing likelihood of injury to forearms, wrists or hands of an operator, the method comprising:

positioning fingers of the operator on the keyboard in a standard QWERTY touch typing configuration;

resting each of the operator's fingers on each finger's associated key, each finger having a particular resting weight applied to each respective key; and wherein each of the respective keys has a keystroke resistance set by an elastomeric spring that is sufficient to resist the resting weight applied.

14. The method of using a keyboard according to claim 13, further comprising depressing one of the keys with a force greater than the keystroke resistance so that the operator causes the key to close.

15. The method of using a keyboard according to claim 13, further comprising moving the operator's hands from the QWERTY position to a new position while keeping the operators' wrist locked.

16. The method of using a keyboard according to claim 13, wherein the keystroke resistance of each key is greater than about 70 grams and less than about 300 grams.

17. A method comprising inserting at least one elastomeric spring in a keyboard to set a keystroke resistance in the keyboard to a minimum level that is sufficient to prevent accidental closure of a plurality of key.

18. A keyboard manufactured in accordance with the method set forth in claim 17.

19. A method comprising:

increasing keystroke resistance of a keyboard by inserting elastomeric springs in the keyboard such that the elastomeric springs are disposed to resist movement of alphanumeric keys of the keyboard, at least some of the elastomeric springs providing a keystroke resistance of between 70 grams and 300 grams.

20. The method of claim 19, said inserting elastomeric springs including inserting an elastomeric template in the keyboard, the template including the elastomeric springs.

21. A method of retrofitting an electronic keyboard to provide increased keystroke resistance, each key of the electronic keyboard having an associated actuator connected to a switch, comprising:

removing selected alphanumeric keys from the electronic keyboard;

positioning booster springs on the electronic keyboard so that each booster spring is operatively coupled to the actuator and switch associated with each of the selected keys; and replacing the selected keys, the booster springs thereby being positioned between the key and each key's actuator so that the keystroke resistance is increased for each of the selected keys.

22. A method of using a keyboard for preventing or reducing likelihood of injury to forearm, wrists or hands of an operator, the method comprising:

typing on the keyboard, the keyboard having a plurality of alphanumeric keys each having a keystroke resistance, the keystroke resistance set by an elastomeric spring at a level sufficient to resist weight of resting fingers of the operator on the keys.

* * * * *

UNITED STATES PATENT AND TRADEMARK OFFICE
CERTIFICATE OF CORRECTION

PATENT NO. : 6,791,480 B1
DATED : September 14, 2004
INVENTOR(S) : Alan K. Uke

It is certified that error appears in the above-identified patent and that said Letters Patent is hereby corrected as shown below:

Column 8,
Line 58, after “key” insert -- switches in alphanumeric keys in the keyboard when a user of the keyboard rests fingers on keys of the keyboard --

Signed and Sealed this

Twenty-fifth Day of January, 2005

JON W. DUDAS
*Director of the United States Patent and Trademark Office*